United States Patent
Bryant et al.

(10) Patent No.: US 6,212,765 B1
(45) Date of Patent: Apr. 10, 2001

(54) METHOD FOR REMOVING MICROELECTRONIC CIRCUITS FROM SUBSTRATES AND TOOL USED IN REMOVAL

(75) Inventors: Terry S. Bryant; Donald J. Beck, both of Palm Bay; James B. Nichols, Indialantic, all of FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/273,599

(22) Filed: Mar. 22, 1999

Related U.S. Application Data

(62) Division of application No. 09/049,835, filed on Mar. 27, 1998, now Pat. No. 5,938,882
(60) Provisional application No. 60/063,163, filed on Sep. 30, 1997.

(51) Int. Cl.[7] ..................................... B23P 19/00
(52) U.S. Cl. .................. 29/739; 29/758; 7/165
(58) Field of Search ............. 29/278, 758, 739; 81/54; 7/167, 165

(56) References Cited

U.S. PATENT DOCUMENTS

| 3,580,462 | * | 5/1971 | Vanyi | 228/51 |
| 4,631,770 | * | 12/1986 | Goldberg | 7/167 |
| 4,700,420 | * | 10/1987 | Belanger | 7/114 |
| 4,962,681 | * | 10/1990 | Yang | 81/54 |
| 5,638,566 | * | 6/1997 | Wu | 7/167 |
| 5,911,481 | * | 6/1999 | Yost | 30/125 |

* cited by examiner

Primary Examiner—Lee Young
(74) Attorney, Agent, or Firm—Harry M. Fleck; Frederick R. Jorgenson

(57) ABSTRACT

The method of removing an epoxy bonded microelectronic component from a substrate includes the steps of heating a removal tool comprising a blade portion. The heated blade portion engages against the cured epoxy positioned around the edge of the component, and the epoxy is removed. The blade portion is positioned between an edge of the component and an adjacent portion of the substrate to lift the component from the substrate. A screwdriver receiving tip can also be attached to the removal tool. The screwdriver receiving tip includes an orifice that receives a screwdriver shaft that is freely rotatable therein. The removal tool is heated, thereby heating the screwdriver receiving tip and screwdriver shaft so that any screw to be removed is heated and removed. A tool is also disclosed for removing the microelectronic component from a substrate. The tool includes a removal tool comprising a proximal body and a distal heating end. A screwdriver receiving tip is removably mounted on the distal heating end of the removal tool. The screwdriver receiving tip has an orifice for receiving a screwdriver shaft.

7 Claims, 4 Drawing Sheets

METHOD FOR REMOVING MICROELECTRONIC CIRCUITS FROM SUBSTRATES AND TOOL USED IN REMOVAL

CROSS-REFERENCE TO RELATED APPLICATION

This application is a division as application Ser. No. 09/049,835, filed Mar. 27, 1998, now U.S. Pat. NO. 5,938,882 and Provisional Patent Application, Ser. No. 60/063,163, filed Sep. 30, 1997.

FIELD OF THE INVENTION

The present invention relates to electronics manufacturing and repair, and more particularly, to removing microelectronic components, such as integrated circuits, from substrates on which the microelectronic components are secured.

BACKGROUND OF THE INVENTION

At present, the electronic industry uses hot gas techniques, precise machining techniques and mechanical removal (chiseling) techniques for non-destructively removing microelectronic integrated circuits (IC's) and other similar microelectronic components, such as staked fasteners, from substrates following epoxy cure. The microelectronic components are removed during upgrades, repair and replacement, or substrate substitution or reuse. In some of the microelectronic component systems, the components have screws (staked fasteners) to aid in securing the component to a substrate. Typically, the screws can be secured by epoxy. The edges of the component can also be bonded by an epoxy, making removal difficult because of the epoxy bond. The three removal techniques mentioned above also have drawbacks.

The use of hot gas may heat the integrated circuit or other similar microelectronic component and the substrate to a temperature in excess of 300 C. This could cause damage to the microelectronic component, thus negating any subsequent use of the component or integrated circuit. Additionally, the excessive temperature could damage other similarly positioned microelectronic components, and in the worst case scenario, the substrate itself could be severely damaged, causing an expensive loss of either the substrate or all components mounted on the substrate.

Very precise machining techniques can be exact enough to remove any surrounding, cured epoxy that secures a microelectronic component to the substrate. However, the machining would require, in addition to exact machining tools and methods, a very precise vacuum wand or draw system with sufficient vacuum controls to prevent debris from flying off and damaging any adjacent microelectronic components or integrated circuits.

Mechanical chiseling is difficult because it requires significant force to be exerted on a small, exactly machined chiseling blade. The excess force exacted on the blade to remove the cured epoxy commonly damages neighboring devices. Mechanical removal techniques also require relatively large forces to be exerted against the substrate, which can damage adjacent components and the substrate itself. This would defeat the purpose of reusing the substrate and associated microelectronic components.

There is, therefore, a need to permit non-destructive integrated circuit and similar microelectronic component removal to permit reuse of those components. If these microelectronic components could be removed successfully without damaging the components themselves, then the substrate could also be reused for other applications. This could create an economic benefit when electronic systems are upgraded, repaired and exchanged.

SUMMARY OF THE INVENTION

It is, therefore, an object of the present invention to provide a method of removing epoxy bonded integrated circuits and other microelectronic components from a substrate that does not damage the microelectronic component itself, as well as any other adjacent components.

It is still another object of the present invention to provide a method of removing epoxy bonded integrated circuits and similar microelectronic components from a substrate that does not use machining, hot gas or a mechanical chiseling processes.

The present invention is advantageous because it provides a method for removing an epoxy bonded microelectronic component from a substrate without using a hot gas, machining or mechanical chiseling process, but allowing microelectronic component removal without excessive damage. The invention also provides a unique tool that is adapted for removing the microelectronic components from the substrate, such as when the microelectronic component includes screws bonded by epoxy, which aid in securing the components to the substrate.

In accordance with the present invention, the method comprises the steps of removing a microelectronic component from a substrate, wherein the component is bonded around the edges thereof by a cured epoxy. The method includes the steps of heating a removing tool comprising a blade portion, engaging the heated blade portion against cured epoxy position around the edge of the component, and removing the epoxy. The method also comprises positioning the blade portion between an edge of the component and an adjacent portion of the substrate to lift the component from the substrate.

In still another aspect of the present invention, the microelectronic component includes screws bonded by epoxy that aid in securing the microelectronic component to the substrate. In such a structure, a screwdriver receiving tip is attached to the removal tool. The screwdriver receiving tip includes an orifice for receiving a screwdriver shaft. The method further comprises the steps of receiving within the orifice a screwdriver shaft that is freely rotatable therein, and heating the removal tool and thereby heating the screwdriver receiving tip and the screwdriver shaft. The method further comprises heating the screws to be removed with the attached screwdriver shaft and removing the screws by engaging the screwdriver shaft with the screws to be removed, and rotating the screwdriver shaft. The microelectronic component is then removed.

If the microelectronic component has been removed after the screws had been removed, then the screwdriver receiving tip is removed from the removal tool, and a blade portion attached thereto. The removal tool is heated, thereby heating the blade portion. The heated blade portion is engaged against any residual, cured epoxy that remains on the substrate to remove the residual epoxy.

The microelectronic component can typically be bonded around the edges thereof by a cured epoxy. It can include screws bonded by epoxy that aid in securing the microelectronic component to the substrate. In this type of system, the screws are first removed, followed by removal of any epoxy bonding the edges of the microelectronic component. The method further comprises the steps of attaching a screwdriver receiving tip to a removal tool, wherein the screwdriver receiving tip includes an orifice for receiving a screwdriver shaft. The screwdriver shaft is received within the orifice so that it is freely rotatable therein. The removal tool is heated, thereby heating the screwdriver receiving tip and screwdriver shaft.

The screw to be removed is heated with the attached screwdriver shaft. The screw is removed by engaging the screwdriver shaft with the screw and rotating the screwdriver shaft. The screwdriver receiving tip and screwdriver shaft are allowed to cool, and then removed. A blade portion is attached to the removal tool. The removal tool is heated, thereby heating the blade portion. The heated blade portion is positioned against the cured epoxy around the edge of the component and the epoxy removed. The blade portion is then positioned between an edge of the component and adjacent portion of the substrate to lift the component from the substrate.

In still another aspect of the present invention, the epoxy is removed from the blade portion prior to the positioning step. The method further comprises the step of scraping off the epoxy from the substrate by the blade portion and removing the scraped epoxy by vacuum. The vacuum can be applied by a vacuum wand, or the blade portion can include a vacuum channel that connects to a source of vacuum.

In accordance with another aspect of the present invention, a removal tool is provided for removing a microelectronic component from a substrate. The removal tool comprises a body having a proximal handle and a heating end, and a heating element positioned in the removal tool that allows heating at the distal heating end.

A screwdriver receiving tip is removably mounted on the distal heating end of the removal tool. The screwdriver receiving tip includes a distal end having an orifice. A screwdriver shaft is received through the orifice. The orifice and screwdriver shaft are dimensioned such that the screwdriver shaft is freely rotatable within the orifice. A blade portion is removably mounted to the removal tool after removal of the screwdriver receiving tip. The heating element further comprises an electric heating coil. The removal tool further comprises a distal threaded receiving end, and the screwdriver receiving tip further comprises a proximal threaded annular attachment end that is screwed onto the threaded receiving end of the removal tool.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied n many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The method of the present invention allows nondestructive removal of an epoxy bonded microelectronic component, such as an integrated circuit from a substrate. The invention is applicable also to staked fasteners having screws, and allows localized heating of the cured epoxy without damaging adjacent microelectronic components.

The present invention will first be described relative to a staked fastener having screws that secure a microelectronic component to the substrate, as well as an epoxy bond around the edges thereof. In accordance with the present invention, the removal tool used in the present invention will also be described.

Figure 2:
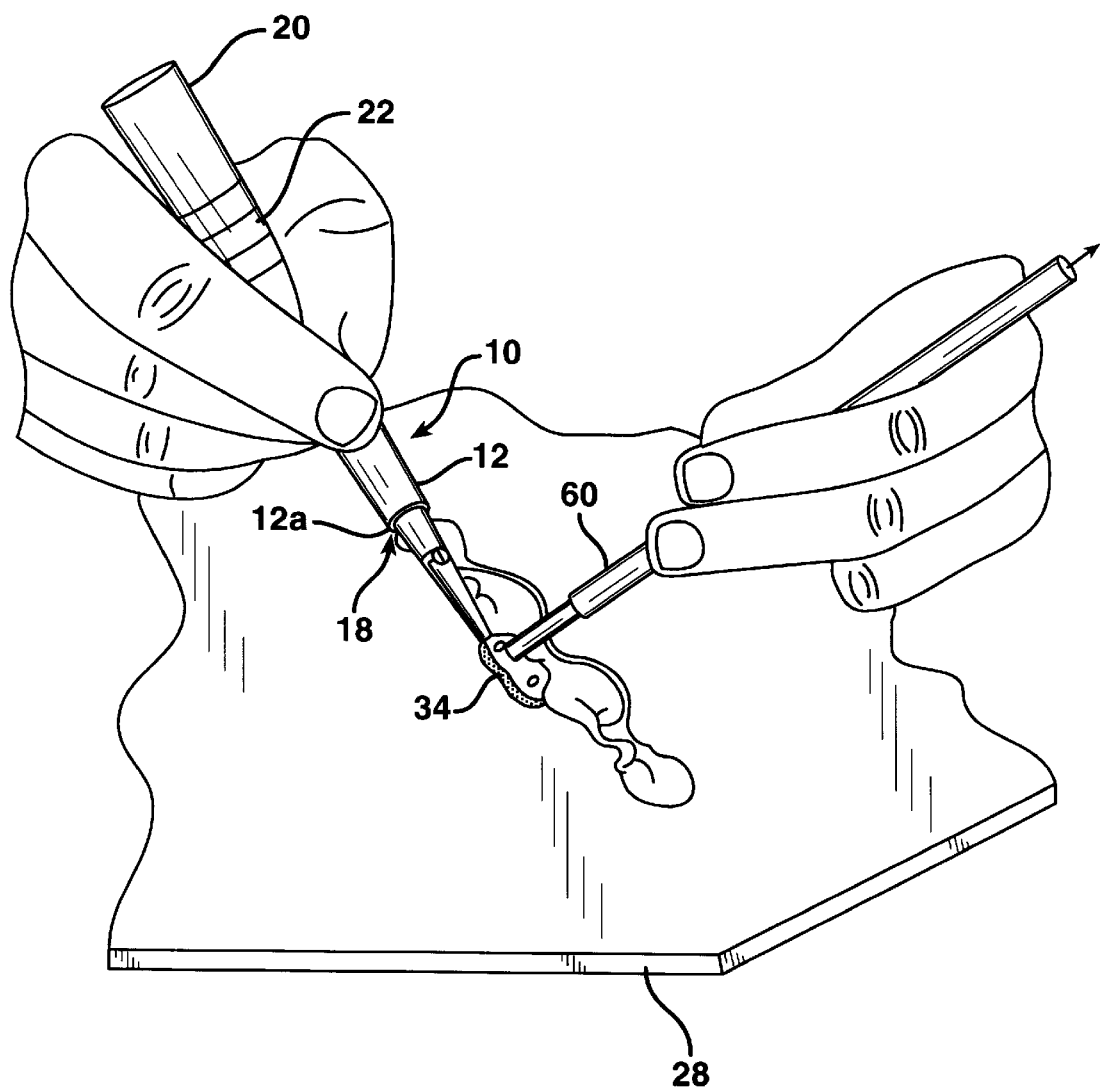
FIG. 2 is another perspective view showing the removal tool and attached blade portion, and a vacuum wand that is manipulated to recover removed epoxy by vacuum.
Figure 3:
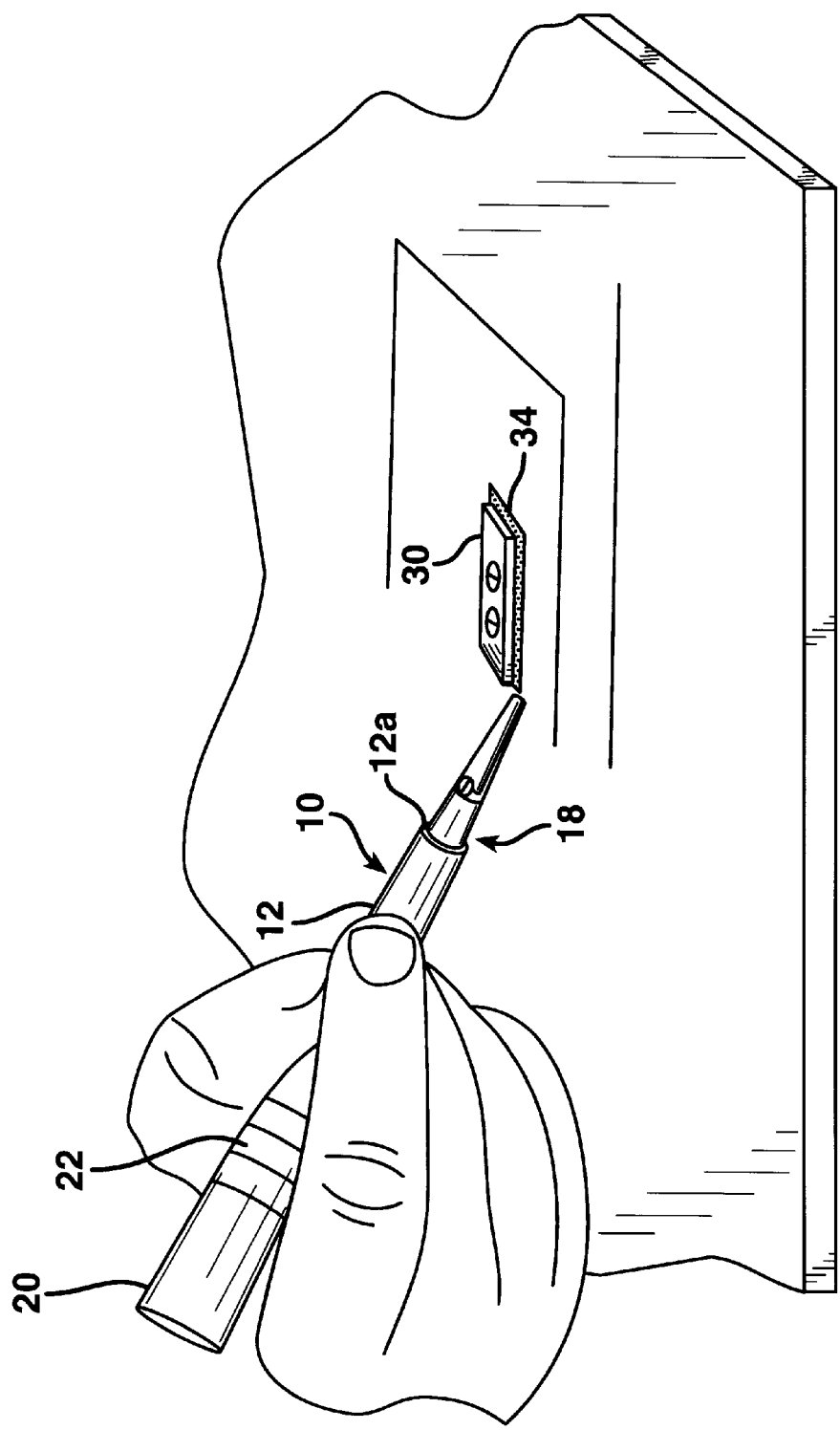
FIG. 3 is still another perspective view showing the blade portion of a removal tool positioned between the edge of the component and an adjacent portion of the substrate to lift the component from the substrate.
Figure 4:
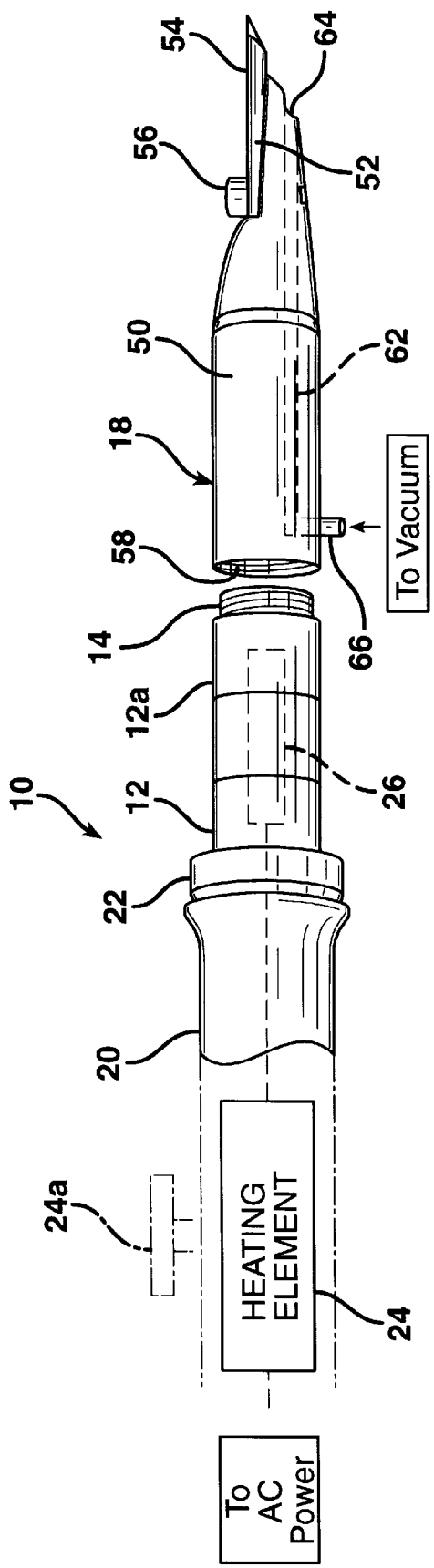
FIG. 4 is a partial perspective view showing the removal tool, blade portion and a heating element in schematic.

Referring now to FIG. 4, there is illustrated a removal tool in accordance with the present invention. As illustrated, the removal tool 10 includes a distal heating end 12a positioned on a cylindrical configured body 12. The heating end 12a includes external screw threads 14 at the end to receive a mounting tool, such as a screwdriver receiving tip 16 (FIG. 1), or a blade portion 18 (FIGS. 2–4). The removal tool 10 also includes a proximal end formed as a handle 20, and secured to the cylindrical body 12 by a coupling 22. The handle 20 includes therein a conventional heating element 24, connected to a heating coil 26 mounted in the body 12, such as typically found in soldering irons and other similar types of heating devices. The heating element 24 connects to a standard source of AC power to allow heating of the distal heating end 12a.

Figure 1:
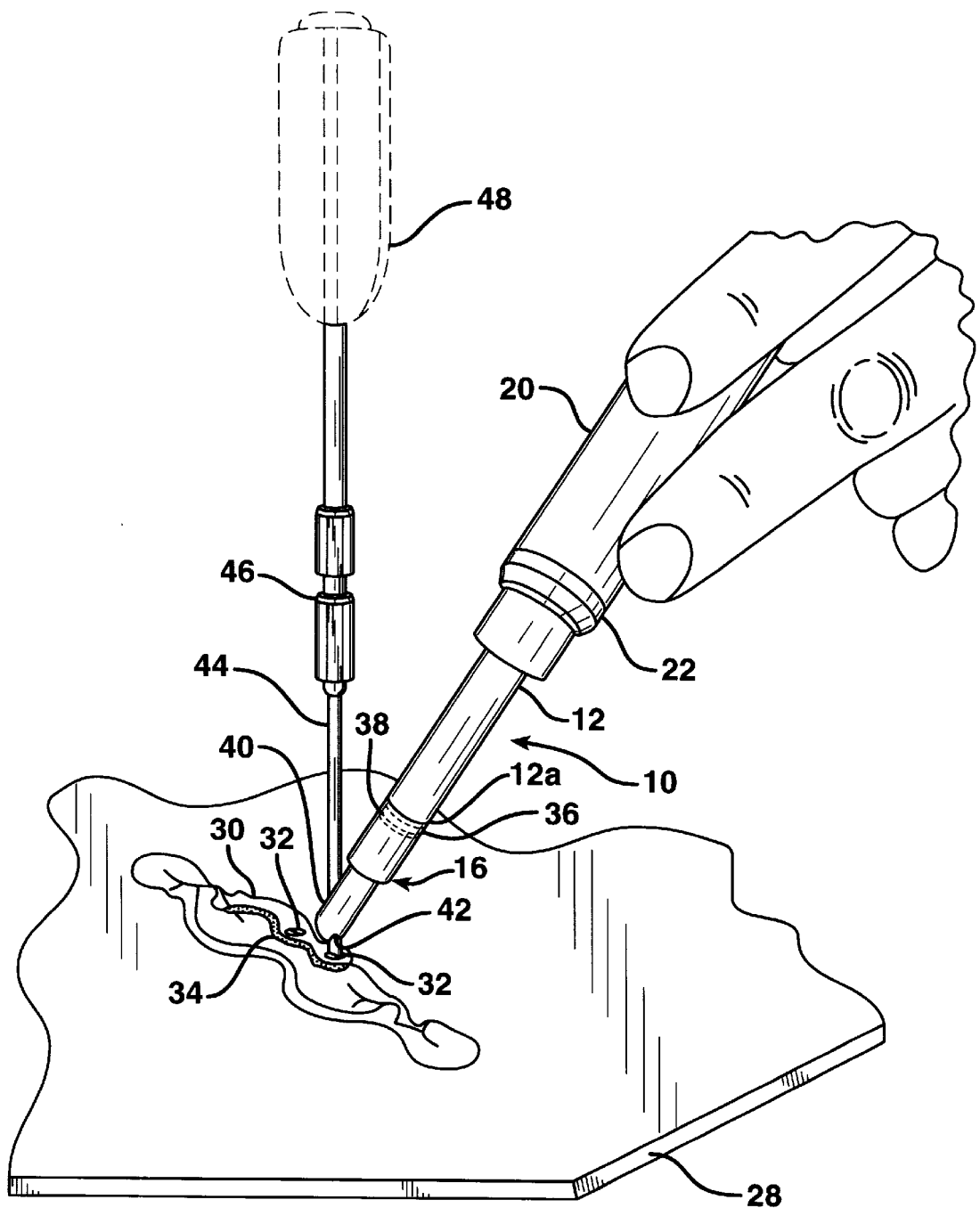
FIG. 1 is a perspective view of the removal tool having an attached screwdriver receiving tip and screwdriver shaft received through the orifice that engages a screw to be removed.

As shown in FIG. 1, a substrate 28, such as conventionally known to those skilled in the art, includes a staked microelectronic component 30 secured to the substrate by two screws 32 that have an epoxy bond, as well an epoxy bond 34 around the edges of the staked microelectronic component 30. It should be understood that the described tool and the removal techniques to be described can be used for integrated circuits and other microelectronic components as suggested by those skilled in the art.

The screwdriver receiving tip 16 is removably mounted on the heating end of a removal tool as illustrated in FIG. 1. The screwdriver receiving tip 16 has an annular configured proximal end 36 that has internal screw threads 38 to permit the screwdriver receiving tip to be screwed onto the screw threads 14 at the distal heating end 12a of the removal tool 10. The screwdriver receiving tip 16 is cylindrically configured and includes a distal end 40 having an orifice 42 that receives a screwdriver shaft 44. The screwdriver shaft 44 is dimensioned relative to the orifice 42 so that the screwdriver shaft 44 is freely rotatable within the orifice 44. As illustrated, the screwdriver shaft 44 includes a connection end 46 that allows connection of the handle 48. Different shafts can. have different ends for engaging different size screws. The same handle can be used.

In accordance with the method of the present invention, the screwdriver receiving tip 16 is attached to the removal tool 10 by screwing the screwdriver receiving tip 16 onto the distal heating end 12a. The proper size screwdriver shaft with a desired end is then received within the orifice 42 of the screwdriver receiving tip. Typically, the distal heating end 12a and screwdriver receiving tip 16 has been heated beforehand to about 700 F. The amount of heat is controlled by control knob 24a adjustment. Thus, when the screwdriver shaft 44 is received within the orifice, the already heated screwdriver receiving tip 16 will conduct heat into the screwdriver shaft 44. Once the screwdriver shaft 44 is hot, the attached handle 48 is grasped by the operator, and the end of the screwdriver shaft placed on the screw 32 to be removed. The epoxy surrounding the screw and the screw itself is heated. The screwdriver shaft is then rctated and the screw removed. This procedure is repeated for any other screws that secure the microelectronic component to the substrate. The heat allows the epoxy bond to be broken without causing excessive damage to the component and substrate.

Once the screws 32 have been removed, the removal tool 10 is allowed to cool sufficiently to allow the operator to remove the screwdriver receiving tip 16 from the removal tool. A blade portion 18 (as illustrated in FIG. 4) is then screwed onto the distal heating end 12a of the removal tool 10. As illustrated, the blade portion 18 includes a support body 50, which includes a ledge 52 for supporting a blade 54 that is secured by an allen nut 56 or similar fastening means. Thus, it is possible to secure different size blades 54 onto the ledge 52 depending on the type of epoxy to be removed, the thickness of the epoxy layer, and the type of microelectronic component that is secured by the epoxy onto the substrate. The support body includes an annular proximal end having internal threads 58 to engage the external threads 14 on the distal heating end 12a of the removal tool.

Once the blade portion 18 has been screwed onto the removal tool 10, the removal tool is heated to about 750 F, imparting heat onto the blade portion and its mounted blade. As shown in FIG. 2, any excess epoxy around the area where the microelectronic component was secured is then scraped off. If the microelectronic component could not have been removed because of associated epoxy bond around the edges of the component, then the epoxy is heated and scraped away from the component edges. As shown in FIG. 2, a vacuum wand 60 is used to suck by vacuum the scraped epoxy from the substrate. The vacuum wand is illustrated as a fine tube and can also, in certain embodiments, be attached to the removal tool. However, in still another embodiment shown in FIG. 4, it is possible to form a vacuum channel 62 in the body of the blade portion. A vacuum orifice 64 is formed at the distal end of the blade portion and can be used to draw the vacuum and remove the epoxy. A vacuum inlet 66 can be formed on the blade portion and connected to a vacuum tube or other source of vacuum.

In the case where the epoxy around the edges of the microelectronic component has to be removed, the blade portion 18 can be positioned between the edge of the component and an adjacent portion of the substrate 28 to lift the component from the substrate, as illustrated in FIG. 3.

Once the microelectronic component has been lifted from the substrate, any excess epoxy can be heated by the blade portion and vacuum drawn either through a separate vacuum wand or within the blade portion, as shown in the illustrated blade portion of FIG. 4, where the vacuum is drawn to a channel in the blade portion into the distal tip where the vacuum draw at the tip removes any epoxy that has been scraped.

It is evident that the present invention now allows removal of microelectronic components, such as integrated circuits, from a substrate, which are secured by an epoxy bond around the edges and on any fasteners, such as screws. The invention allows for non-destructive removal and is advantageous because the microelectronic components can be used again.

It is also possible that the substrate can be used again, thus saving costs.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the cope of the dependent claims.

That which is claimed:

1. A tool for removing a microelectronic component from a substrate, wherein the component includes screws bonded by epoxy that aid in securing the component to the substrate, comprising:

a removal tool comprising a distal heating end;

a screw driver receiving tip removably mounted on the heating end of the removal tool, said screw driver receiving tip further comprising an orifice;

a screwdriver shaft received through said orifice, wherein said orifice and screwdriver shaft are dimensioned such that said screwdriver shaft is freely rotatable within said orifice; and means for heating said heating end of said removal tool.

2. A tool according to claim 1, and further comprising a blade portion that is removably mountable to said removal tool after removal of said screwdriver receiving tip.

3. A tool according to claim 1, wherein said blade portion includes a ledge for supporting a blade.

4. A tool according to claim 1, wherein said means for heating said removal tool further comprises an electric heating coil.

5. A tool according to claim 1, wherein said removal tool further comprises a distal end having external threads, and said screwdriver receiving tip further comprises a proximal end having internal threads to be received on the external threads.

6. A tool according to claim 1, wherein said removal tool further comprises a proximal body.

7. A tool according to claim 6, wherein said proximal body is configured as a handle.

* * * * *